United States Patent [19]
Fletcher et al.

[11] 4,045,728
[45] Aug. 30, 1977

[54] DIRECT READING INDUCTANCE METER

[76] Inventors: James C. Fletcher, Administrator of the National Aeronautics and Space Administration, with respect to an invention of; Richard B. Kolbly, Barstow, Calif.

[21] Appl. No.: 677,351

[22] Filed: Apr. 15, 1976

[51] Int. Cl.² .................................................. G01R 27/26
[52] U.S. Cl. ...................................... 324/59; 324/57 H
[58] Field of Search ............... 324/59, 57 H, 79 R, 324/79 D, 81

[56] References Cited
U.S. PATENT DOCUMENTS

| | | | |
|---|---|---|---|
| 3,403,338 | 9/1968 | Martin | 324/79 D |
| 3,480,857 | 11/1969 | Bialko et al. | 324/59 X |
| 3,670,243 | 6/1972 | Fougere et al. | 324/59 X |

Primary Examiner—Stanley T. Krawczewicz
Attorney, Agent, or Firm—Monte F. Mott; Paul F. McCaul; John R. Manning

[57] ABSTRACT

A direct reading inductance meter is comprised of a crystal oscillator for generating a reference frequency $f_r$ and an LC tuned oscillator for generating an initial frequency $f_o$ which, when mixed with the reference, produces a difference equal to zero. Upon connecting an inductor of small unknown value in the LC circuit to change its resonant frequency to $f_x$, a difference frequency $(f_r-f_x)$ is produced that is very nearly a linear function of the inductance of the inductor. The difference frequency is measured and displayed on a linear scale in units of inductance.

9 Claims, 3 Drawing Figures 4,045,728

DIRECT READING INDUCTANCE METER

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to apparatus for direct measurement of small values of inductance.

When developing and testing RF circuits, it is often necessary to use inductances of very low value, such as inductances in the range from $10^{-8}$H to $3\times10^{-6}$H. Known apparatus available for measuring inductances of such low value are either expensive, time consuming, or both. The least expensive technique known for measuring the impedance of a circuit element involves the use of a Wheatstone bridge in which a known element is compared with an unknown element. For resistors, the technique is quite satisfactory using DC current to avoid the effects of reactance in the measurement circuit, but for capacitors or inductors, which require AC current for the measurement, the problem is to first balance the bridge with known elements of equal value in order to balance out the effects of reactance in the measurement circuit before substituting an unknown element for one of the known elements.

Another technique for measuring inductance or capacitance utilized in a system disclosed in U.S. Pat. No. 3,480,857 depends upon detecting the change in resonant frequency of an LC tuned circuit. Cycles of the resonant frequency are first counted up for a predetermined period with a known element in the circuit. Then the unknown element is inserted, or substituted, and cycles of the new resonant frequency are counted down for the same predetermined period. The difference is proportional to the ratio of the unknown element to the known element. This requires knowing the value of the known element to the same degree of accuracy required for the unknown element, and is subject to the accuracy and stability of the system in measuring the predetermined period for counting cycles at both frequencies.

SUMMARY OF THE INVENTION

It has been recognized that for small values of inductance inserted in an LC tank circuit to change its resonant frequency, the change in frequency will be linearly proportional to the change in inductance in a range below $3\mu H$. The tank circuit is used in an LC tuned oscillator to produce an output signal at a frequency $f_o$ without the unknown element inserted. The output signal of the oscillator is mixed with a reference signal from a stable oscillator operating at a frequency $f_r$ to produce a difference frequency $f_r-f_o$ equal to zero. The element of unknown value is then inserted into the tank circuit to change the frequency of the LC oscillator, and as a consequence increase the difference frequency from the mixer proportional to the increase in the value of the inserted element. The output frequency of the mixer is measured to determine the value of the element inserted.

The novel features of the invention are set forth with particularity in the appended claims. The invention will best be understood from the following description when read in conjunction with the accompanying drawings.

DESCRIPTION OF PREFERRED EMBODIMENTS

Figure 1:
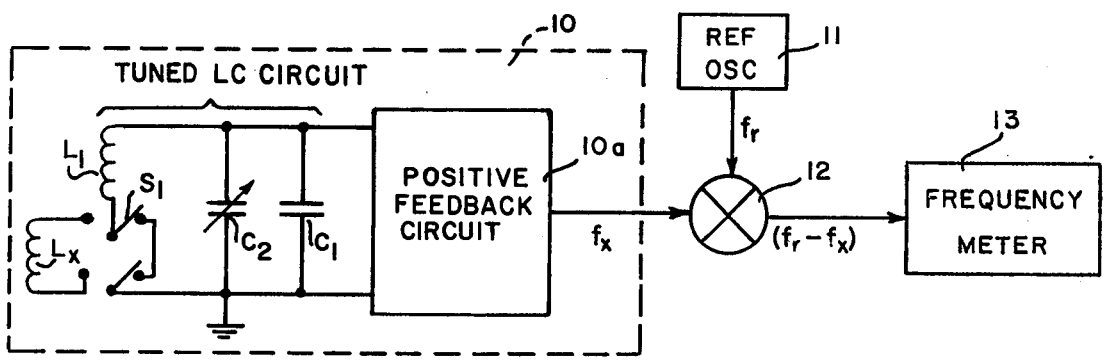
FIG. 1 is a functional block diagram of the present invention.

Referring now to the drawings, FIG. 1 illustrates the technique of the present invention for measuring the value of an unknown inductive element by inserting the element in a tuned LC circuit of an oscillator 10 to shift the output frequency of the oscillator from its tuned frequency $f_o$ (equal to a constant reference frequency $f_r$) to a frequency $f_x$. A reference oscillator 11 is preferably implemented with a crystal to provide a very stable reference frequency.

The frequencies of the oscillators 10 and 11 are combined in a mixer 12 to produce a difference frequency $f_r-f_x$ which is proportional to the inductance of the element inserted into the LC circuit of the oscillator 10. A frequency meter 13 measures and displays the difference $f_r-f_x$ for direct calibrated reading of the measured inductance.

The oscillator 10 is comprised of the tuned LC circuit, which determines the initial oscillating frequency, $f_o$, and a positive-feedback circuit 10a, which makes up losses in the resonant LC circuit. This type of circuit is preferred because of its simplicity of design and construction. The criterion for oscillation of such a feedback oscillator is that the loop gain exceed unity at the frequency of oscillation. However, the oscillator may also be of the type which employs negative impedance to make up the losses.

In the LC circuit, a double-pole, double-throw switch $S_1$ connects an inductor $L_1$ in parallel with a fixed capacitor $C_1$ and at least one variable capacitor $C_2$. The variable capacitor is employed to tune the resonant frequency of the parallel LC circuit to the frequency $f_r$ from the oscillator 11. Once the output frequency $f_o$ of the oscillator 10 is tuned to the frequency $f_r$, i.e., when the difference $f_r-f_x$ is equal to zero, the frequency meter 13 will read zero. For initial tuning, the signal at frequency $f_o$ could be compared with the signal at frequency $f_r$ on an oscilloscope, but it is only necessary to tune for a zero meter reading.

Having tuned the oscillator 10 to the frequency of the reference oscillator 11, the element $L_x$ of unknown inductance to be measured is connected to the LC circuit in such a way as to increase the inductance of the LC circuit. To accomplish that, the double-pole, double-throw switch $S_1$ is placed in its alternate position thus connecting the unknown element $L_x$ in series with the inductor $L_1$. Placing the element $L_x$ in series with the inductor $L_1$ will increase the inductance of the LC circuit to decrease the output frequency of the oscillator 10. In that manner, the oscillator 10 is detuned to a frequency $f_x$ which, upon being mixed with the reference frequency, $f_r$, produces a difference $f_r-f_x$ which is very nearly a linear function of the inductance added to the LC circuit. Consequently, upon measuring the difference in the frequency meter 13, a direct reading of the inductance of the unknown element, $L_x$, is provided.

Figure 2:
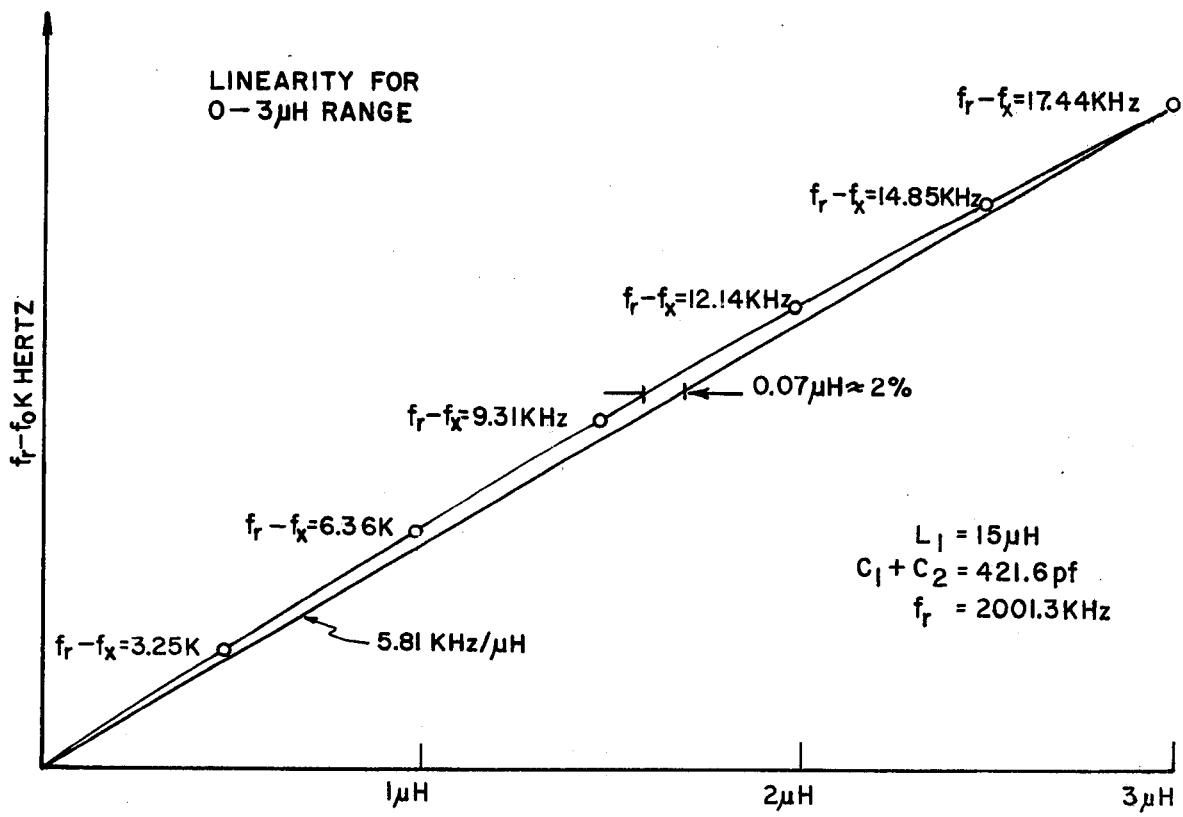
FIG. 2 is a graph of inductance measurements made below $3\mu H$ in accordance with the present invention.

FIG. 2 illustrates in a graph the degree of linearity between the frequency difference $f_r-f_x$ and the inductance of the element $L_x$ for a range of inductance from 0 to 3 microhenries using an LC circuit initially tuned to a frequency $f_o$ equal to 20001.3 KHz with the inductor $L_1$ equal to 15 microhenries and the sum of the capacitors $C_1$ and $C_2$ equal to 421.6 picofarads. Since these measurements deviate from linearity by less than about 3%, a frequency meter implemented with an ammeter (as will be described more fully hereinafter with reference to FIG. 3) may be calibrated linearly, that is to say calibrated with equally spaced scale units, thus assuming precise linearity in the relationship between the inductance of the unknown element and the frequency difference $f_r - f_x$.

Figure 3:
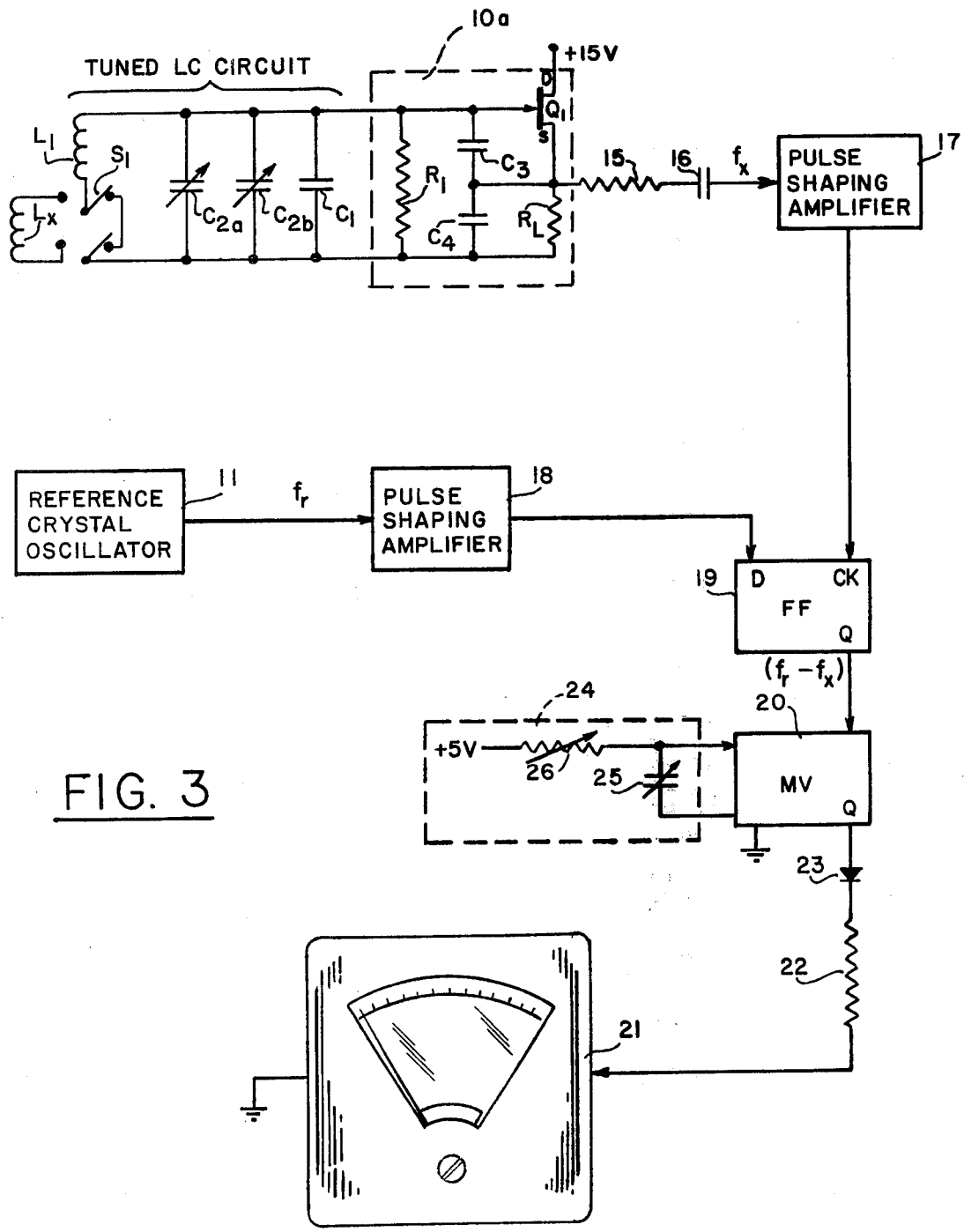
FIG. 3 is a circuit diagram of an exemplary embodiment of the invention.

Referring now to FIG. 3, the oscillator 10 is illustrated in an exemplary embodiment of the invention as being comprised of a type 2N3819 field-effect transistor $Q_1$ having a positive feedback circuit comprising capacitors $C_3$ and $C_4$ between the gate electrode of the transistor and circuit ground, with the junction between the capacitors connected to the source electrode of the transistor and a load resistor $R_L$ in parallel with the capacitor $C_4$. A resistor $R_1$ in parallel with the series connected capacitors $C_3$ and $C_4$ completes the positive feedback circuit 10a. The drain electrode of the transistor is connected directly to +15 V. The capacitors $C_3$ and $C_4$ are selected to be 500 and 1000 picofarads respectively, and the resistor $R_1$ is selected to be 1MΩ. The capacitor $C_1$ is selected to be about 43 picofarads for a central output frequency of the oscillator with two variable capacitors $C_{2a}$ and $C_{2b}$ at midrange. The capacitor $C_{2a}$ is variable from 0.8 to 10 picofarads for fine adjustment and the capacitor $C_{2b}$ is variable from 2 to 50 picofarads for more coarse adjustment of the initial frequency $f_o$ of the oscillator to the output frequency of the reference oscillator 11 operating at 2,000 KHz. This adjustment of the initial frequency is made with the double-pole, double-throw switch $S_1$ in the position shown to place only the fixed inductor $L_1$ of 15 microhenries in the LC circuit.

The output signal of the oscillator 10 is coupled by a resistor 15 and a capacitor 16 to a pulse shaping amplifier 17 which produces a rectangular output pulse for each cycle of the oscillator. The pulse train output varies between a low level (virtually circuit ground potential) and a high level (about +2 V.). The output of the reference oscillator 11 is similarly coupled to a pulse shaping amplifier 18 which produces a pulse train output which varies between the same low and high levels. The data input terminal of a D-type flip-flop 19 is connected to the output of the pulse shaping amplifier 18. The clock input terminal of that flip-flop is connected to the output of the pulse shaping amplifier 17.

The flip-flop is triggered on the positive going edge of a pulse applied to its clock input terminal. The data input completely determines the state the flip-flop will assume after each positive edge on the clock input terminal. Consequently, the Q output terminal of the flip-flop will be high if the data input terminal is high, and low if the data input terminal is low. The result of the interaction of pulse train outputs from the pulse shaping amplifiers 17 and 18 on the clock and data input terminals of the D-type flip-flop is that the Q output terminal will change state from high to low at a rate proportional to the difference in frequency of the waveforms applied to the data and clock input terminals.

The output of the flip-flop 19 is connected to the trigger input terminal of a monostable multivibrator 20 which responds to every positive going transition of the Q output terminal of the flip-flop 19 to produce a pulse of predetermined width (less than the period of the difference $f_r - f_x$) such that a pulse train is produced by the multivibrator at a rate proportional to the frequency difference $f_r - f_x$. An ammeter 21 of the damped moving-coil type is coupled to the Q output terminal of the multivibrator by a resistor 22 and diode 23. The damped moving-coil of the meter functions as a lossy-integrator of pulses to produce a current reading which is linearly proportional to the rate of pulses from the multivibrator.

For calibration and scaling purposes, the period of the pulses produced by the multivibrator 20 may be adjusted by an external RC timing circuit 24 schematically represented as a variable resistor 25 and variable capacitor 26. In practice, the variable capacitor 26 would be implemented by a bank of capacitors of different sizes from which one may be selected for connection to the multivibrator, and the variable resistor 25 would be implemented as a bank of fixed resistors of different sizes, each with a small trimming potentiometer in series. A rotary switch for selecting one of the capacitors is ganged with a switch for selecting one of the resistors such that for every resistor selected, an appropriate one of the capacitors is selected. Each selection then provides a different RC timing which can be adjusted within a limited range by the trimming potentiometer.

Although a particular embodiment of the invention has been described and illustrated herein, it is recognized that modifications and equivalents may readily occur to those skilled in the art. Consequently, it is intended that the claims be interpreted to cover such modifications and equivalents.

What is claimed is:

1. Apparatus for direct measurement of the inductance exhibited by an element which is essentially inductive in a range below 3μH, comprising means for generating a first alternating signal at a stable reference frequency, $f_r$, means for generating a second alternating signal at an initial frequency, $f_o$, substantially equal to said reference frequency, said second signal generating means including an LC circuit tuned to resonance at said initial frequency $f_o$ to control the frequency of said second signal, said LC circuit having an inductance at least approximately five times greater than said element, switching means for connecting said element to be measured to said LC circuit to change the resonant frequency thereof to a frequency $f_x$, means for mixing said first and second signals to obtain a third signal of a frequency equal to the difference between the frequencies $f_r$ and $f_x$, and means for measuring the frequency of said third signal and for displaying the value of said element as a linear function of the frequency of said third signal.

2. Apparatus as defined in claim 1 wherein said frequency measuring means is comprised of means for generating a pulse of predetermined pulse width for each cycle of said third signal, and a lossy-integration and display means for so integrating each of said pulse of predetermined pulse width as to produce a display of the value of said element as a linear function of the rate of said pulses integrated.

3. Apparatus as defined in claim 2 wherein said lossy-integration and display means is comprised of an ammeter.

4. A direct reading inductance meter comprising
a reference oscillator for generating a reference signal at a stable frequency,
an LC tuned oscillator for generating a second signal at a frequency equal to said reference frequency as determined by an included LC tuned circuit,
a mixer for mixing said second signal with said reference signal to obtain an output signal at a difference frequency equal to the difference between said reference frequency and said second frequency,
means for connecting an element of unknown inductance of some unknown value less than about $3\mu H$ to said LC tuned circuit having an inductance at least approximately five times greater than the unknown element thereby to shift said second frequency by an amount approximately in linear proportion to said unknown value of inductance, and
means for measuring the frequency of said output signal with said element connected to said LC tuned circuit for determining said unknown value of inductance as a linear function of said difference frequency.

5. Apparatus as defined in claim 4 wherein said frequency measuring means is comprised of
a separate pulse shaping amplifier for each of said reference and second signals to produce a reference train of pulses and a second train of pulses from said reference signal and second signal, respectively, one pulse in each train for each cycle of the signal being amplified,
a flip flop adapted to be set in response to a particular point in each pulse of one of said trains of pulses to a state determined by the voltage level of the other of said trains of pulses,
a multivibrator responsive to the output of said flip-flop to produce an output pulse of predetermined duration for each cycle of said flip-flop, and
means for integrating output pulses from said multivibrator with a lossy integrator, thereby producing a signal the average amplitude of which is proportional to the unknown inductance of said element.

6. Apparatus as defined in claim 5 wherein said last named means is comprised of means for rectifying said output pulses, and an ammeter connected to measure the current output of said rectifying means.

7. Apparatus as defined in claim 4 wherein said LC tuned circuit is comprised of a circuit of inductance and capacitance in parallel, and said unknown element is connected by said connecting means in series with the inductance of said parallel circuit.

8. Apparatus as defined in claim 7 wherein said frequency measuring means is comprised of
a separate pulse shaping amplifier for each of said reference and second signals to produce a reference train of pulses and a second train of pulses from said reference signal and second signal, respectively, one pulse in each train for each cycle of the signal being amplified,
a flip-flop adapted to be set in response to a particular point in each pulse of one of said trains of pulses to a state determined by the voltage level of the other of said trains of pulses,
a multivibrator responsive to the output of said flip-flop to produce an output pulse of predetermined duration for each cycle of said flip-flop, and
means for integrating output pulses from said multivibrator with a lossy integrator, thereby producing a signal the average amplitude of which is proportional to the unknown inductance of said element.

9. Apparatus as defined in claim 8 wherein said last named means is comprised of means for rectifying said output pulses, and an ammeter connected to measure the current output of said rectifying means.

* * * * *